US00RE37424B1

(19) United States
(12) Reissued Patent
Contiero et al.

(10) Patent Number: US RE37,424 E
(45) Date of Reissued Patent: Oct. 30, 2001

(54) MIXED TECHNOLOGY INTEGRATED DEVICE COMPRISING COMPLEMENTARY LDMOS POWER TRANSISTORS, CMOS AND VERTICAL PNP INTEGRATED STRUCTURES HAVING AN ENHANCED ABILITY TO WITHSTAND A RELATIVELY HIGH SUPPLY VOLTAGE

(75) Inventors: Claudio Contiero, Buccinasco; Paola Galbiati, Monza; Lucia Zullino, Milan, all of (IT)

(73) Assignee: STMicroelectronics S.R.L. (IT)

This patent issued on a continued prosecution application filed under 37 CFR 1.53(d), and is subject to the twenty year patent term provisions of 35 U.S.C. 154(a)(2).

(21) Appl. No.: 08/943,326

(22) Filed: Oct. 3, 1997

Related U.S. Patent Documents

Reissue of:
(64) Patent No.: 5,041,895
Issued: Aug. 20, 1991
Appl. No.: 07/535,774
Filed: Jun. 8, 1990

U.S. Applications:

(63) Continuation of application No. 08/625,974, filed on Apr. 1, 1996, now abandoned, which is a continuation of application No. 08/083,277, filed on Jun. 28, 1993, now abandoned.

(30) Foreign Application Priority Data

Jun. 14, 1989 (IT) ..... 83626 A/89

(51) Int. Cl.[7] ..... H01L 29/06; H01L 29/10; H01L 27/02

(52) U.S. Cl. ..... 257/370; 257/378; 438/202; 438/206

(58) Field of Search ..... 257/370, 378, 257/335, 336, 337, 338, 371; 438/202, 206, 209, 549

(56) References Cited

U.S. PATENT DOCUMENTS 4,120,707 10/1978 Beasom .

(List continued on next page.)

FOREIGN PATENT DOCUMENTS

0179693 * 4/1986 (EP) .
2186117 * 8/1987 (GB) .

(List continued on next page.)

OTHER PUBLICATIONS

S. M. Sze, *Semiconductor Devices Physics and Technology*, John Wiley & Sons, New York (1985) pp. 401–2.*

*Primary Examiner*—Sara Crane
(74) *Attorney, Agent, or Firm*—David V. Carlson; Theodore E. Galanthay; Lisa K. Jorgenson

(57) ABSTRACT

Complementary LDMOS and MOS structures and vertical PNP transistors capable of withstanding a relatively high voltage may be realized in a mixed-technology integrated circuit of the so-called "smart power" type, by forming a phosphorus doped n-region of a similar diffusion profile, respectively in: The drain zone of the n-channel LDMOS transistors, in the body zone of the p-channel LDMOS transistors forming first CMOS structures; in the drain zone of n-channel MOS transistors belonging to second CMOS structures and in a base region near the emitter region of isolated collector, vertical PNP transistors, thus simultaneously achieving the result of increasing the voltage withstanding ability of all these monolithically integrated structures. The complementary LDMOS structures may be used either as power structures having a reduced conduction resistance or may be used for realizing CMOS stages capable of operating at a relatively high voltage (of about 20V) thus permitting a direct interfacing with VDMOS power devices without requiring any "level shifting" stages. The whole integrated circuit has less interfacing problems and improved electrical and reliability characteristics.

19 Claims, 2 Drawing Sheets

U.S. PATENT DOCUMENTS 4,628,341 * 12/1986 Thomas ..... 257/370
4,710,241 * 12/1987 Komatsu ..... 257/591
4,887,142 * 12/1989 Bertotti et al. ..... 257/338
4,890,142 * 12/1989 Tonnel et al. ..... 257/343
4,918,026 * 4/1990 Kosiak et al. ..... 257/370
4,928,164 * 5/1990 Tanizawa ..... 257/370
4,962,052 * 10/1990 Asayama et al. ..... 257/370
5,156,989 * 10/1992 Williams et al. ..... 437/41

FOREIGN PATENT DOCUMENTS 61-281544 * 12/1986 (JP) .
1-140759 * 6/1989 (JP) .
1-272145 * 10/1989 (JP) .

* cited by examiner

MIXED TECHNOLOGY INTEGRATED DEVICE COMPRISING COMPLEMENTARY LDMOS POWER TRANSISTORS, CMOS AND VERTICAL PNP INTEGRATED STRUCTURES HAVING AN ENHANCED ABILITY TO WITHSTAND A RELATIVELY HIGH SUPPLY VOLTAGE

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is a continuation of U.S. patent application Ser. No. 08/625,974, filed Apr. 1, 1996, now abandoned; which is a continuation of U.S. patent application Ser. No. 08/083,277, filed Jun. 28, 1993, now abandoned; which is a reissue application of U.S. patent application Ser. No. 07/535,774, filed Jun. 8, 1990, U.S. Pat. No. 5,041,895.*

BACKGROUND OF THE INVENTION

1. Field of the Invention

The present invention relates to a mixed technology, "smart power", integrated device containing power transistors and control logic and analog driving circuitry combined in a monolithic silicon chip.

2. Description of the Prior Art

The commercial success of so-called "smart power" integrated circuits, wherein the analog signal processing circuitry, the control logic circuitry and the output power devices are conveniently monolithically integrated in a single chip, originated and sprung from the overcoming of compatibility problems among the different fabrication processes relative to the different integrated devices, often necessarily operating under different supply voltages. Most often, even though non-exclusively, the power section of such integrated circuits employs VDMOS transistors which typically require a driving gate voltage level comprised between about 10 V–20 V.

This makes difficult interfacing the power transistor (e.g. VDMOS) with the driving circuitry. Commonly, in fact, the maximum operating voltage of CMOS transistors used in logic circuitry is 5 V. Conversely, the driving circuitry for power transistors operate at about 12 V, while in order to ensure a driving level on the gate of a VDMOS power transistor of 10 V and if a reasonable process "spread" is accounted for, the supply voltage of CMOS transistors of the relative driving circuit should be at least 15 V. Moreover better operating conditions of a VDMOS power transistor (i.e. a lower resistance $R_{on}$) may be achieved if the driving voltage level on the gate may be raised to 15–20 V, as it is well known to a skilled technician.

In "smart power" type integrated circuits, this particular problem is commonly obviated by using a "level shifter" circuit, which necessarily makes the driving circuit more complicated.

There is a definite need for the availability of CMOS transistors having an operating voltage of about 20 V in a monolithically integrated semiconductor device of the "smart power" type in order to drive directly the output power transistors with a relatively high voltage without employing special level shifter circuits.

On the other hand, in these integrated circuits there are other CMOS and bipolar transistors which are employed, because of their peculiar characteristics, in control logic circuitry and in signal processing circuitry, respectively. Also the utility and reliability of these other integrated devices could be advantageously enhanced if also these other integrated devices could be made capable of withstanding a higher supply voltage than the voltage normally allowed by the physical structure of these integrated devices produced through a mixed-technology fabrication process.

OBJECTIVE AND SUMMARY OF THE INVENTION

In view of this state of the art, the present invention has the main objective of providing, in a monolithically integrated "smart power" type device, CMOS structures and isolated collector, vertical, PNP transistors capable of withstanding a higher operating voltage than the voltage normally withstood by these devices, when they are formed monolithically together in a single chip.

This objective is reached by the integrated device of the invention, as defined in the annexed claims.

Structurally the device is characterized by the fact that it comprises regions of phosphorus doped, n-type silicon of similar diffusion profile extending from the surface of the n-type epitaxial layer wherein the different devices are formed, respectively, through the drain area of n-channel LDMOS transistors extending between the gate electrode thereof and the adjacent isolating field oxide, the body area of p-channel LDMOS transistors, extending between the gate electrode thereof and the adjacent isolation field oxide, the drain area of n-channel MOS transistors, extending between the gate electrode thereof and the adjacent isolation field oxide, and the emitter area of isolated collector vertical PNP bipolar transistors, and by a depth sufficient to contain, respectively, the $n^+$ doped drain region of n-channel LDMOS transistors, the $p^+$ doped source region of p-channel LDMOS transistors, the $n^+$ doped drain region of n-channel MOS transistors and the $p^+$ doped emitter region of the PNP transistors.

In the case of an n-channel LDMOS transistor, the presence of this auxiliary n-doped region, obtained by implanting phosphorus through the drain area, increases the breakdown voltage because the field intensity between the drain and the gate is reduced while obtaining a reduction too of the conducting resistance ($R_{on}$) of the transistor, which is extremely advantageous when the LDMOS transistor itself is used as an integrated power switching device, as it is often the case in these mixed technology integrated devices.

In the case of a p-channel LDMOS transistor, the same auxiliary $n^-$ doped region may conveniently constitute a body region which is so formed without other specific additional process steps.

The CMOS structures formed by pairs of complementary LDMOS transistors, when provided with such an n-doped region by phosphorus implantation, become capable of operating with a supply voltage of about 20 V without requiring special precautions, such as "field plates", thus remaining advantageously compact.

In the case of an n-channel MOS transistor belonging to another type of CMOS structure, the n-doped region, obtained by phosphorus implantation in the drain area of the transistor, reduces the sensitivity to electrical stresses due to hot electrons, by acting as a "drain extension" region; this permits to the transistor to withstand a supply voltage of about 12 V.

In the case of an isolated collector, vertical PNP bipolar transistor, the additional n-doped region obtained by phosphorus implantation through the emitter area of the transistor, permits to improve the transistor's performance transistors by increasing the charge in the base region of the transistor and to increase the "punch-through" voltage between emitter and collector.

The parallel ability of the different CMOS structures and vertical PNP transistors to withstand a specifically increased operating voltage specifically increased permits to build mixed technology integrated circuits (i.e. "smart power" devices) with far less pronounced interfacing problems among the different types of circuits, with enhanced possibilities of fully exploiting the intrinsic peculiarities of the different devices and with a higher degree of reliability.

BRIEF DESCRIPTION OF THE DRAWINGS

The peculiar aspects and advantages of the present invention, will become evident through the following detailed description of a preferred embodiment illustrated as a nonlimitative example in the attached drawings, wherein.

DESCRIPTION OF THE BEST MODE

Figure 1:
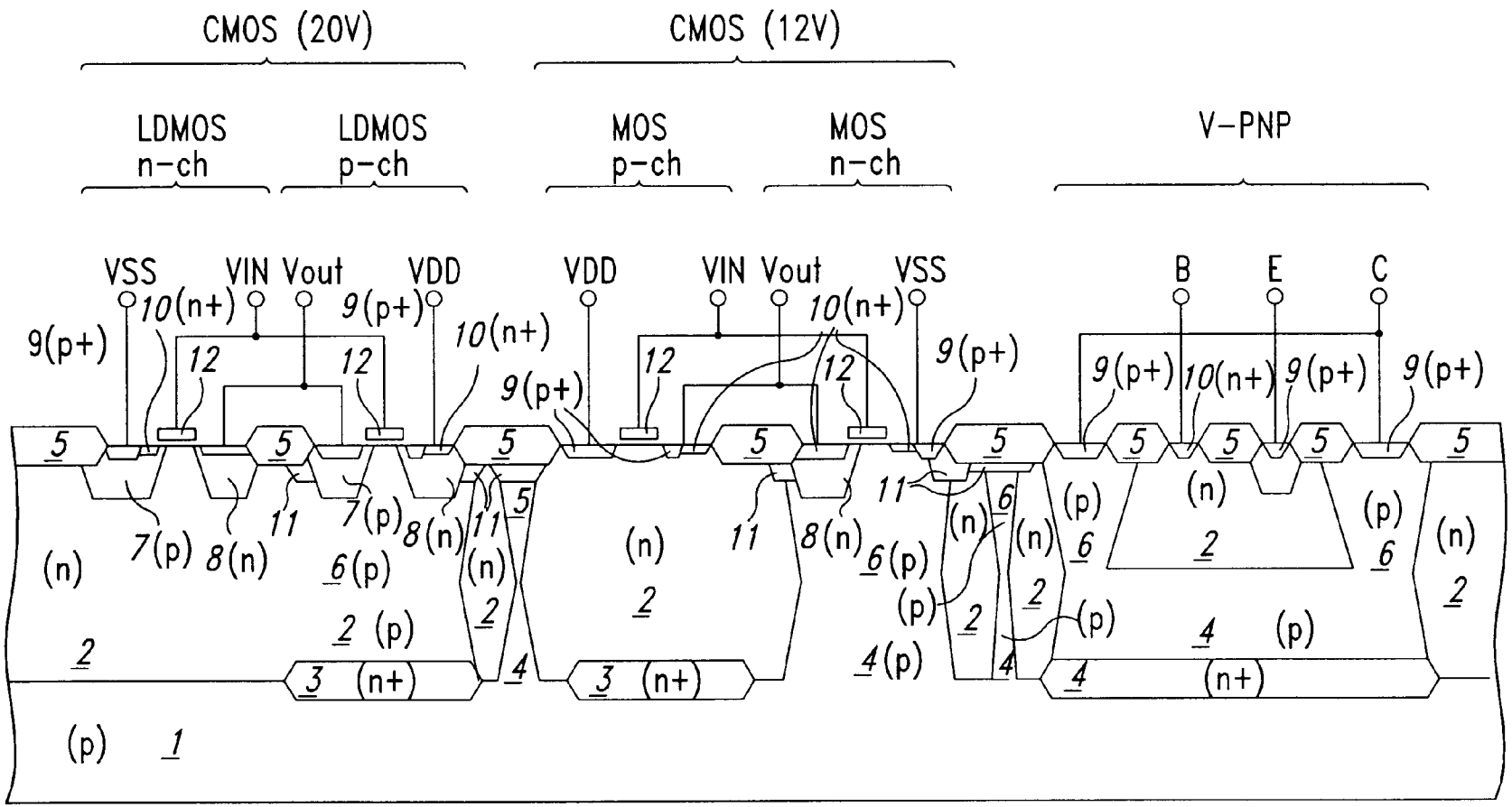
FIG. 1 is a partial schematic, sectional view of an integrated circuit made in accordance with the present invention.

An hypothetical partial cross section of an integrated "smart power" type integrated device, wherein it is relatively easy to put in evidence, though in a schematic way, the aspects of the invention, is shown in FIG. 1. The depicted cross section does not include VDMOS power transistors, which may be easily imagined present in a different zone of the integrated device from the zone shown in the partial cross section of the figure, wherein two different CMOS structures are depicted, a first structure formed by an n-channel and a p-channel LDMOS transistor and a second structure formed by a p-channel and by an n-channel MOS transistor, and the structure of an isolated collector, vertical PNP bipolar transistor.

The device comprises a p-type silicon substrate 1 on which an epitaxial n-type silicon layer 2 has been grown after doping with arsenic and/or with boron certain areas defined on the surface of the monocrystalline silicon substrate 1 in order to form the $n^+$ buried layers 3 and the p-type bottom isolations 4. The integrated device further comprises an isolation structure among the different integrated devices which, in the depicted example, is formed by a field oxide layer 5 grown on the surface of the silicon 2, after doping with boron [predifined] *predefined* areas on the silicon surface in order to form, in accordance with well known techniques, the p-well regions 6 (i.e. top isolations and p-well) as well as regions with a heavier boron doping charge 11, also known as p-field region, while growing the field oxide 5, according to a known technique.

Within active areas destined to the formation of MOS-type devices, gate structures 12, commonly of doped polycrystalline silicon, are formed.

Typically the n-channel, LDMOS transistor comprises a p-body region 7, produced in the silicon by implanting boron under self-alignment conditions in the source area extending between the gate 12 and the field oxide 5 and by successively diffusing the implanted boron until obtaining the desired diffusion profile of the region 7, the $n^+$ source and drain junctions 10 and the $p^+$ region 9 having a relatively high doping level formed in the source region for contacting the body region 7.

Similarly a p-channel LDMOS transistor comprises a p-doped region 7 (having substantially the same profile of the n-channel LDMOS body region), formed in the drain region of the transistor, the $p^+$ drain and source junctions 9 and the $n^+$ region 10, formed in the source area in order to contact an n-body region, the formation of which together with other n-regions in the different integrated structures according to the present invention will be described later.

The p-channel MOS transistor forming the second CMOS structure depicted in FIG. 1, comprises, as usual, the source and drain $p^+$ junctions 9 and a "back gate" contact, $n^+$ region 10, formed in the source zone of the transistor. Similarly the n-channel MOS transistor comprises the $n^+$ source and drain junctions 10 and a "back gate" contact, $p^+$ region 9, formed in the source zone of the transistor.

The structure of the isolated collector PNP vertical transistor comprises the collector (C) and emitter (E) contact $p^+$ diffusions 9 and the base (B) $n^+$ contact diffusion 10.

In accordance with the present invention, an n-type region 8, doped with phosphorus, extends from the surface of the epitaxial layer respectively in the drain area of the n-channel LDMOS transistor extending between the gate electrode and the isolation field oxide, in the source area of the p-channel LDMOS transistor extending between the gate electrode and the isolation field oxide, in the drain area of the n-channel MOS transistor extending between the gate electrode and the adjacent isolation field oxide and in the emitter area of the isolated collector PNP bipolar transistor defined by the surrounding isolation field oxide, for a depth sufficient to contain at least, respectively, the $n^+$ drain junction of the n-channel LDMOS transistor, the $p^+$ source junctions and $n^+$ body contact regions of the p-channel LDMOS transistor, the $n^+$ drain junction of the n-channel MOS transistor and the $n^+$ emitter junction of the PNP transistor.

These n-type regions 8 are made evident in the schematic cross section depicted in FIG. 1 by means of a thick line.

As it will be evident to the skilled technician, the distinct regions 8 may be easily formed simultaneously in the indicated zones without requiring critical process steps by simply implanting phosphorus under self-alignment conditions in the indicated areas and by diffusing the implanted phosphorus before proceeding to the formation of the heavily doped $n^+$ regions obtained by implanting arsenic and diffusing it and of the heavily doped $p^+$ regions obtained by implanting boron and diffusing it, which are contained within said auxiliary regions 8. In a normal fabrication process the doping level of this additional n-region 8 may be comprised between $10^{13}$ and $10^{14}$ (phosphorus) atoms per cubic centimeter.

Figure 2:
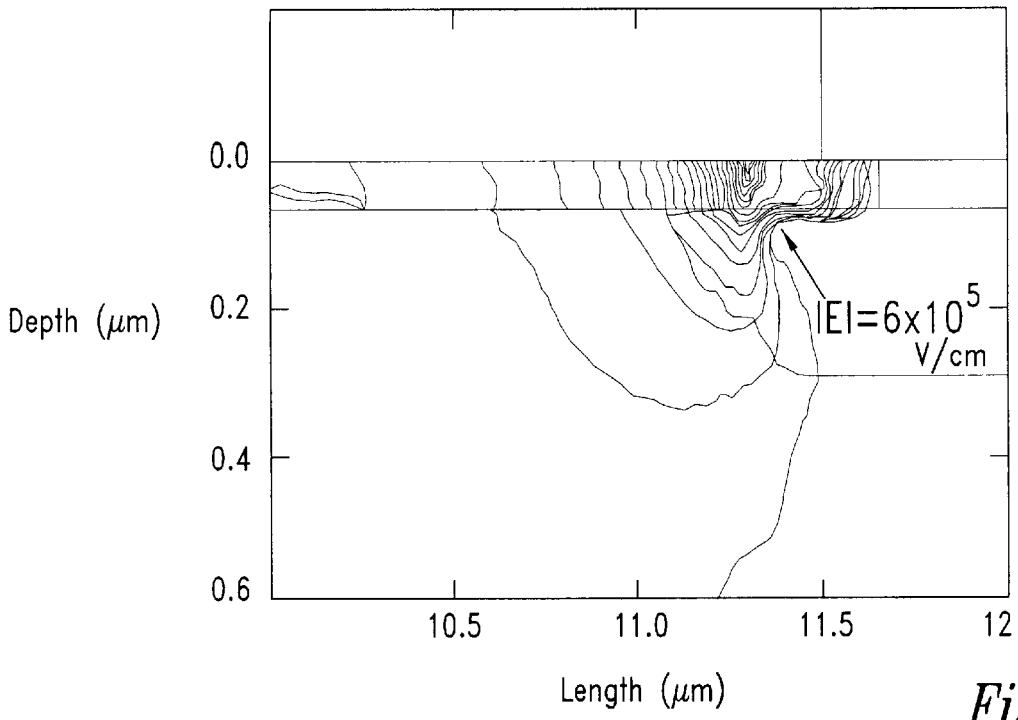
FIG. 2 shows equimodal, electric field lines in the overlapping region between the gate and the drain region of an n-channel LDMOS transistor of the prior art, without the additional n-doped region of the invention, produced by computer simulation.

Shown in FIG. 2 are the equimodal electric field lines in the overlapping region between the drain and the gate of an n-channel LDMOS transistor having a 600 Angstroms (A) thick gate oxide, produced by means of computer model simulation for the case of a transistor without the auxiliary n-doped region (8 of FIG. 1) in accordance with the present invention and subjected to a 20 V bias. The maximum electric field intensity is evaluated to be $6\times10^5$ V/cm.

Figure 3:
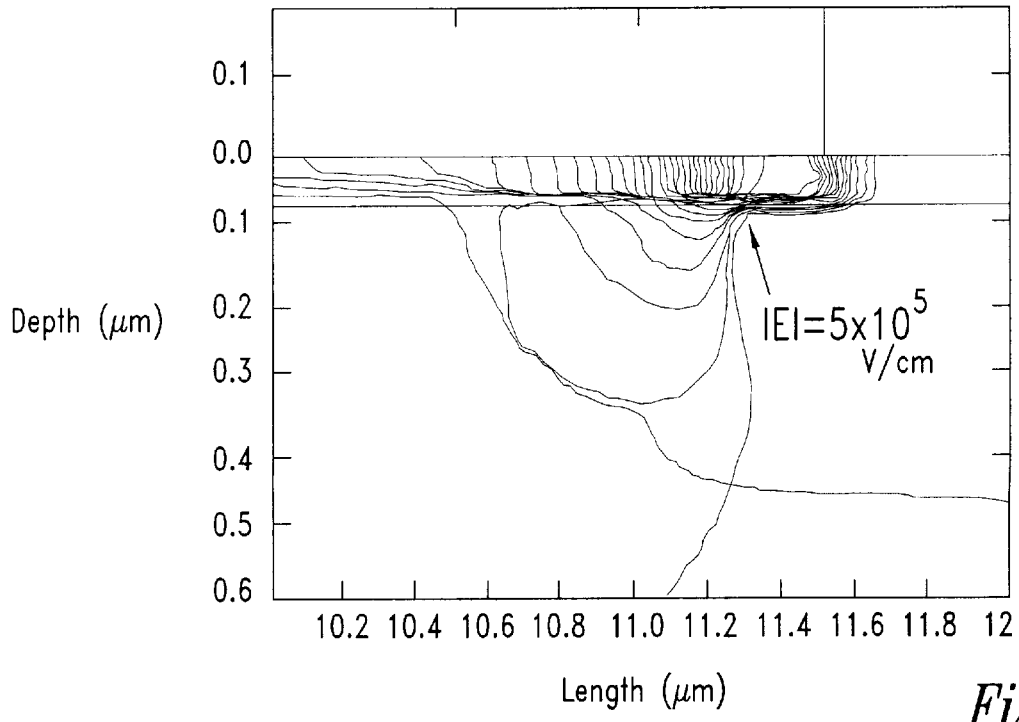
FIG. 3 shows equimodal electric field lines in the same overlapping region of the preceding figure, in the case of a transistor provided with the additional n-doped region in accordance with the present invention, produced by computer simulation.

Similarly, shown in FIG. 3 are the equimodal electric field lines in the same overlapping region under identical bias conditions (20 V) of the example shown in FIG. 2, but wherein the n-channel LDMOS transistor is provided with the auxiliary n-region, doped with phosphorus at $10^{14}$ atoms per cubic centimeter, in accordance with the present invention. As it is easily noted by comparing the FIGS. 2 and 3, in the latter the equimodal electric field lines are more "distended" than those of FIG. 1 and the maximum field electric intensity may be evaluated to be $5\times10^5$ V/cm. This is 17% less than the maximum intensity evaluated in the case of the transistor of the prior art without the [auxialiary] *auxiliary* phosphorus doped region.

The CMOS structure formed by the complementary LDMOS transistors provided with the n-doped region 8 (FIG. 1) in accordance with the present invention may [funtions] *functions* with a supply voltage of 20 V and it may be directly interfaced, as a driving device, with VDMOS power transistors for example, thus eliminating the need for adequate level shifting circuits. Moreover, an LDMOS transistor structure modified according to the invention is intrinsically capable of withstanding voltages in the order of 20 V without requiring the formation of "field plates" (according to a known technique for increasing the intrinsic breakdown voltage of integrated transistors) which inevitably clashes with compactness requirements of these integrated structures.

Naturally, as it will appear evident to the skilled technician, the complementary LDMOS transistors, depicted as forming a CMOS structure in FIG. 1, may themselves be employed as power transistors through an appropriate layout configuration, exploiting also for such applications, the same improved performance in terms of voltage withstanding ability and reduced resistance ($R_{on}$), derived by the presence of said additional n-region 8, in accordance with the present invention.

Also the electrical performances of the other CMOS structure shown, formed by the pair of complementary MOS transistors, are improved because the n-region 8 formed in the drain region of the n-channel transistor acts as a drain extension region thus increasing the nominal operating voltage of the relative CMOS structure.

Another, [non-negligeable] advantage is obtained also in terms of improved performance of the isolated collector, vertical PNP bipolar transistor by providing also this integrated device with the n-region 8 doped with phosphorus [enchroaching] *encroaching* in the base region of the transistor. The consequent increase of the doping level of the base region reduces sensitivity to depletion of the base region thus increasing the punchthrough voltage between emitter and collector. This permits also to this integrated component of the "smart power" device to function under a relatively high voltage, thus broadening the possibility of employing this type of transistor which is outstandingly suited, in respect to other types of transistors, for implementing circuits with a higher cut-off frequency then that which may be obtained by means of lateral PNP transistors.

What we claim is:

1. A monolithically integrated circuit formed in an n-type [epitaxial] silicon layer grown on a p-type [monocrystalline] silicon substrate and comprising at least a first CMOS structure formed by a pair of complementary LDMOS transistors, the first having an n-type channel and the other a p-type channel, a second CMOS structure formed by a pair of complementary MOS transistors, a first having a p-type channel and the other an n-type channel, and at least an isolated collector, vertical PNP bipolar transistor,

[characterized by] comprising:

phosphorus doped n-type silicon regions having the same diffusion profile which extend from the surface of said [epitaxial] *n-type silicon* layer, respectively in:

a drain [area] *region* of said n-channel LDMOS transistor defined between a gate electrode of the transistor and an adjacent isolation field oxide, a [source area] *body region* of said p-channel LDMOS transistor defined between a gate electrode of the transistor and an adjacent isolation field oxide, a drain [area] *region* of said n-channel MOS transistor, defined between a gate electrode of the transistor and an adjacent isolation field oxide, and

[an emitter area] *a base region* of said isolated collector, vertical, PNP transistor, defined by a surrounding isolation field oxide, into said [epitaxial] *n-type silicon* layer by a depth sufficient to contain, respectively:

an n+ drain diffusion of said n-channel LDMOS transistor, a p+ source diffusion of said p-channel LDMOS transistor, an n+ drain diffusion of said n-channel MOS transistor, and a p+ emitter diffusion and further extending beyond said p+ emitter diffusion into a base region of said isolated collector, vertical, PNP transistor.

*2. The monolithically integrated circuit as claimed in claim 1 wherein said first and second LDMOS transistors form a CMOS structure capable of operating a with driving voltage level of 20 V.*

*3. The monolithically integrated circuit as claimed in claim 1 wherein said first and second MOS transistors form a CMOS structure capable of operating with a driving voltage level of 12 V.*

*4. An integrated circuit fabricated in a silicon layer having a first conductivity type on a substrate having a second conductivity type opposite that of the first conductivity type, the integrated circuit including first and second LDMOS transistors, a MOS transistor, and an isolated collector vertical bipolar transistor, comprising:*

*a drain region of the first LDMOS transistor having the first conductivity type and extending from a surface of the silicon layer to a sufficient depth to contain a shallower more heavily doped region of the first conductivity type formed in the drain region;*

*a body region of the second LDMOS transistor formed in a region of the silicon layer doped to have the second conductivity type, the body region having the first conductivity type and extending from the surface of the silicon layer to a sufficient depth to contain a shallower more heavily doped region of the second conductivity type formed in the body region;*

*a drain region of the MOS transistor formed in a region of the silicon layer doped to have the second conductivity type, the drain region having the first conductivity type and extending from the surface of the silicon layer to a sufficient depth to contain a shallower more heavily doped region of the first conductivity type formed in the drain region; and*

*a base region of the isolated collector vertical bipolar transistor, the base region including a first region of the first conductivity type extending from the surface of the silicon layer to a depth greater than a depth of a shallower more heavily doped region of the second*

*conductivity type formed in the first region, and the base region further including a second region in which the first region is formed, the second region formed from a portion of the silicon layer that is encompassed by a well region of the second conductivity type, the second region extending from the surface of the silicon layer to a depth greater than the depth of the first region.*

*5. The circuit of claim 4 wherein the first conductivity type is n-type and the second conductivity type is p-type.*

*6. An integrated circuit fabricated in a silicon layer having a first conductivity type on a substrate having a second conductivity type opposite that of the first conductivity type, comprising;*

*a first LDMOS transistor having a drain region between a gate electrode of the first LDMOS transistor and an adjacent isolation field oxide, the drain region having the first conductivity type and extending from a surface of the silicon layer to a sufficient depth to contain a shallower more heavily doped region of the first conductivity type;*

*a second LDMOS transistor having a body region between a gate electrode of the second LDMOS transistor and an adjacent isolation field oxide, the body region having the first conductivity type and extending from the surface of the silicon layer to a sufficient depth to contain a shallower more heavily doped region of the second conductivity type;*

*a MOS transistor having a drain region between a gate electrode of the MOS transistor and an adjacent isolation field oxide, the drain region having the first conductivity type and extending from the surface of the silicon layer to a sufficient depth to contain a shallower more heavily doped region of the first conductivity type; and*

*an isolated collector vertical bipolar transistor having a base region surrounded by an isolation field oxide, the base region having a first region of the first conductivity type that extends from the surface of the silicon layer to a sufficient depth to contain a shallower more heavily doped region of the second conductivity type and the base region further having a second region formed from a portion of the silicon layer that is encompassed by a well region of the second conductivity type, the second region extending from the surface of the silicon layer to a sufficient depth to contain the first region.*

*7. The circuit of claim 6 wherein the first conductivity type is n-type and the second conductivity type is p-type.*

*8. The circuit of claim 6 wherein the silicon layer is an n-type epitaxial layer.*

*9. An integrated circuit, comprising:*

*a p-type substrate;*

*an n-type epitaxial silicon layer overlying the p-type substrate, the n-type epitaxial silicon layer having a surface;*

*an n-channel LDMOS transistor having a drain region between a gate electrode of the n-channel LDMOS transistor and an adjacent isolation field oxide, the drain region having an $n^-$ type doping profile extending from the surface of the n-type epitaxial silicon layer to a sufficient depth to contain a shallower more heavily doped region which has an n+ type doping profile;*

*a p-channel LDMOS transistor having a body region between a gate electrode of the p-channel LDMOS transistor and an adjacent isolation field oxide, the body region having an $n^-$ type doping profile extending from the surface of the n-type epitaxial silicon layer to a sufficient depth to contain a shallower more heavily doped region which has a p+ type doping profile;*

*an n-channel MOS transistor having a drain region between a gate electrode of the n-channel MOS transistor and an adjacent isolation field oxide, the drain region having an $n^-$ type doping profile extending from the surface of the n-type epitaxial silicon layer to a sufficient depth to contain a shallower more heavily doped region which has an n+ type doping profile;*

*a p-channel MOS transistor; and*

*an isolated collector, vertical PNP transistor having a base region surrounded by an isolation field oxide, the base region having a first region with an $n^-$ type doping profile that extends from the surface of the n-type epitaxial silicon layer to a sufficient depth to contain a shallower more heavily doped p+ emitter region, and the base region further having a second region formed from a portion of the n-type epitaxial silicon layer that is encompassed by a p-well region, the second region extending from the surface of the n-type epitaxial silicon layer to a sufficient depth to contain the first region.*

*10. An integrated circuit, comprising:*

*a p-type substrate;*

*an n-type epitaxial silicon layer overlying the p-type substrate, the n-type epitaxial silicon layer having a surface;*

*an n-channel LDMOS transistor, including*

*a drain region formed in the n-type epitaxial layer between a gate electrode of the n-channel LDMOS transistor and an adjacent isolation field oxide, the drain region having a diffused $n^-$ doping profile extending from the surface of the n-type epitaxial silicon layer to a sufficient depth to contain a shallower more heavily doped region that has an n+ type doping profile, and*

*a body region formed in the n-type epitaxial layer between the gate electrode of the n-channel LDMOS transistor and an adjacent isolation field oxide, the body region having a p-type doping profile extending from the surface of the n-type epitaxial silicon layer to a sufficient depth to contain a shallower more heavily doped n+ type source region;*

*a p-channel LDMOS transistor, including*

*a drain region between a gate electrode of the p-channel LDMOS transistor and an adjacent isolation field oxide, the drain region having a p-type doping profile extending from the surface of the n-type epitaxial silicon layer to a sufficient depth to contain a shallower more heavily doped region which has a p+ type doping profile, and*

*a body region between the gate electrode of the p-channel LDMOS transistor and an adjacent isolation field oxide, the body region having a diffused $n^-$ doping profile extending from the surface of the n-type epitaxial silicon layer to a sufficient depth to contain a shallower more heavily doped p+ type source region;*

*an n-channel MOS transistor, including*

*a drain region between a gate electrode of the n-channel MOS transistor and an adjacent isolation field oxide, the drain region having a diffused $n^-$ doping profile extending from the surface of the n-type epitaxial silicon layer to a sufficient depth to contain a shallower more heavily doped region that has an n+ type doping profile, and*

*an n+ type source region formed in a p-well region between the gate electrode of the n-channel MOS transistor and an adjacent isolation field oxide;*

*a p-channel MOS transistor, including*

*a p+ type drain region formed in the n-type epitaxial layer between a gate electrode of the p-channel MOS transistor and an adjacent isolation field oxide, and*

*a p+ type source region formed in the n-type epitaxial layer between the gate electrode of the p-channel MOS transistor and an adjacent isolation field oxide; and*

*an isolated collector vertical PNP transistor, including*

*a base region surrounded by an isolation field oxide and including a first region with a diffused $n^-$ doping profile that extends from the surface of the n-type epitaxial silicon layer to a sufficient depth to contain a shallower more heavily doped p+ emitter region, the base region further having a second region comprising a portion of the n-type epitaxial silicon layer that is encompassed in a p-well region, the second region extending from the surface of the n-type epitaxial silicon layer to a sufficient depth to contain the first region, and an n+ type region formed between an isolation field oxide and the isolation field oxide surrounding the base region to extend from the surface of the n-type epitaxial silicon layer into the second region; and*

*an isolated collector region extending into the p-well encompassing the second region.*

*11. An integrated circuit fabricated in an n-type silicon layer on a p-type substrate, comprising:*

*an n-channel LDMOS transistor including an n+ source region contact having a depth and a p-type body region in the silicon layer surrounding and having a depth greater than the depth of the n+ source region contact, a gate capacitively coupled to the p-type body region near the source region contact to create a voltage-controlled conduction channel in the body region, and an n+ drain region contact having a depth and a diffused $n^-$ lightly-doped drain region in the silicon layer surrounding and having a depth greater than the depth of the n+ drain region contact, the n+ drain region contact positioned on the opposite side of the channel as the n+ source region contact; and*

*a p-channel LDMOS transistor including a p+ source region contact having a depth and a diffused $n^-$ lightly-doped body region in a p-doped portion of the n-type silicon layer surrounding and having a depth greater than the depth of the p+ source region contact, a gate capacitively coupled to the body region near the source region contact to create a voltage-controlled conduction channel in the body region, and a p+ drain region contact having a depth and a p-type lightly-doped drain region in the p-doped portion of the silicon layer surrounding and having a depth greater than the depth of the p+ drain region contact, the p+ drain region contact positioned on the opposite side of the channel as the p+ source region contact.*

*12. The circuit of claim 11 wherein the p-type body region of the n-channel LDMOS transistor has a diffusion profile which is the same as that of the p-type lightly doped drain region of the p-channel LDMOS transistor.*

*13. The circuit of claim 11 wherein the n-type lightly doped drain region of the n-channel LDMOS transistor has a diffusion profile which is the same as that of the n-type body region of the p-channel LDMOS transistor.*

*14. The circuit of claim 11 wherein the p-type body region of the n-channel LDMOS transistor has a diffusion profile which is the same as that of the p-type lightly doped drain region of the p-channel LDMOS transistor and the n-type lightly doped drain region of the n-channel LDMOS transistor has a diffusion profile which is the same as that of the n-type body region of the p-channel LDMOS transistor.*

*15. A method for fabricating an integrated circuit, comprising the steps of:*

*providing a semiconductor substrate having a first conductivity type;*

*forming on the substrate a silicon layer having a second conductivity type;*

*forming in the silicon layer a first region of the second conductivity type, a second region of the first conductivity type adjacent the first region, a third region of the first conductivity type isolated by an isolation region from the second region, and forming a fourth region of the second conductivity type in a portion of first-conductivity type formed in the silicon layer;*

*diffusing simultaneously into each of the first, second, third and fourth regions an impurity of the second conductivity type to form in each of the respective regions a diffused region, each diffused region having the same dopant concentration and depth; and*

*diffusing into the diffused regions an additional dopant of a higher concentration to a depth more shallow than the depth of the diffused regions to form a more highly doped region in each of the diffused regions.*

*16. The method of claim 15, further including the steps of forming in the first, second, third, and fourth regions, first and second LDMOS transistors, a MOS transistor, and an isolated collector vertical bipolar transistor, respectively.*

*17. The method of claim 15 wherein the first conductivity type is p-type and the second conductivity is n-type.*

*18. The method of claim 15 wherein the silicon layer is an epitaxial n-type silicon layer.*

*19. The method of claim 15 wherein the step of diffusing simultaneously includes the step of forming diffused regions having a doping density of $10^{13}$ to $10^{14}$ phosphorous atoms per cubic centimeter.*

* * * * *